United States Patent [19]

Tanaka et al.

[11] Patent Number: 4,990,409
[45] Date of Patent: Feb. 5, 1991

[54] FLAME RETARDANT ELECTRICAL LAMINATE

[75] Inventors: Kazuyuki Tanaka; Etsuji Iwami, both of Hitachi; Akinori Hanawa, Shimotsuma; Mitsuo Yokota, Yuki, all of Japan

[73] Assignee: Hitachi Chemical Company, Ltd., Tokyo, Japan

[21] Appl. No.: 225,355

[22] Filed: Jul. 28, 1988

[30] Foreign Application Priority Data

Aug. 20, 1987 [JP] Japan ................... 62-207230

[51] Int. Cl.$^5$ .................. B32B 27/10; B32B 15/08
[52] U.S. Cl. .................. 428/481; 428/503; 428/530; 428/921; 428/436; 428/430
[58] Field of Search ............ 428/481, 503, 530, 921

[56] References Cited
U.S. PATENT DOCUMENTS 4,521,491 6/1985 Oizumi et al. .................. 428/481

FOREIGN PATENT DOCUMENTS 1173341 8/1984 Canada .................. 428/481

Primary Examiner—P. C. Sluby
Attorney, Agent, or Firm—Antonelli, Terry, Stout & Kraus

[57] ABSTRACT

A flame retardant electrical laminate prepared by impregnating a base material with a halogen-containing unsaturated polyester resin which is prepared by dissolving a halogen-containing unsaturated polyester into a polymerizable monomer; and then curing the halogen-containing unsaturated polyester resin; wherein the halogen-containing unsaturated polyester has a molecular weight per 1 mole of unsaturated group of 350 to 1,000, and the cured halogen-containing unsaturated polyester resin has a glass transition temperature of 30° to 90° C.

Such electrical laminates not only have excellent flame redardancy but also excellent puching quality at wide temperature range including room temperature.

15 Claims, No Drawings

FLAME RETARDANT ELECTRICAL LAMINATE

BACKGROUND OF THE INVENTION (a) Field of the Invention

The present invention relates to a flame retardant electrical laminate, more precisely, to a flame retardant electrical laminate of low temperature punching type having an improved punching quality and wide operating temperature range.

In the present invention, electrical laminate means laminated or unlaminated insulating boards, metal foil clad laminates, and the like, which are sheets of generally 0.1 to 15 mm in thickness to be used as, for example, substrates for electronic parts and base materials for printed circuit boards.

(b) Description of the Related Art

Unsaturated polyester resins due to their excellent properties, such as high electrical insulation, low water absorption, and good heat resistance and mechanical properties, have been used for various uses, for example, as insulating varnishes and molding materials for coil sealing.

The resins are also impregnated into a base material, mainly into a cellulosic base material, and then cured after lamination, to produce electrical laminates having superior electrical insulation property, low water absorption and moisture absorption, excellent soldering heat resistance and mechanical properties, etc. Thus formed electrical laminates have been used as laminated insulating boards, copper clad laminates prepared by adhering a copper foil thereto, and the like, in electrical equipment and communication equipment.

In these uses, there are various flame retardant standards for securing electrical equipment, communication equipments, etc. against fire, such as UL standard in the United States and BS standard in the United Kingdom, and these standards require electrical laminates to have a flame retardancy satisfying these standards.

There may be various methods for improving the flame retardancy of electrical laminates, and it is most effective to use flame proofed flame retardant unsaturated polyester resins as the unsaturated polyester resin to be used for preparation of these laminates.

In order to satisfy the above-mentioned flame retardancy standards, the flame retardant unsaturated polyester resins to be used should be highly flame proofed.

In electrical laminates, there are not only the demand for such a high flame retardancy, but also a demand for good punching quality because these electrical laminates when processed are generally shaped or holed by means of punching.

In recent years, owing to increasing densification of electrical circuits and increasing miniaturization of electrical parts to be mounted on electrical laminates, such as IC and VLSI, which have caused the increase of the number of pins and reduction of the pin intervals, there is a demand for more highly excellent punching quality.

However, because of the hardness and brittleness of the flame retardant unsaturated polyester resins, the use of flame retardant unsaturated polyester resins for the purpose of obtaining satisfactory flame retardancy makes it necessary to soften laminates by heating prior to or simultaneously to punching. In such a situation that the number of the pins in IC and VLSI is increasing and the pin intervals are reducing, the dislocation of holes which may be occurred by expansion of laminates caused by the heating is undesirable, and there therefore is a requirement for an improved punching quality which enables punching at temperatures lowered nearer to room temperatures.

Since the expansion coefficient of laminates increases sharply when the cured flame retardant unsaturated polyester resin is heated over its glass transition temperature, it is desirable to conduct punching operation at the glass transition temperature or lower.

SUMMARY OF THE INVENTION

The object of the present invention is to provide a flame retardant electrical laminate having such an excellent punching quality that punching operation can be conducted efficiently at a wide temperature range including low temperatures near room temperatures.

According to the present invention, there is provided a flame retardant electrical laminate prepared by impregnating a base material with a halogen-containing unsaturated polyester resin which is prepared by dissolving a halogen-containing unsaturated polyester into a polymerizable monomer; and then curing the halogen-containing unsaturated polyester resin; wherein the halogen-containing unsaturated polyester has a molecular weight per 1 mole of unsaturated group of 350 to 1,000, and the cured halogen-containing unsaturated polyester resin has a glass transition temperature of 30° to 90° C.

PREFERRED EMBODIMENT OF THE INVENTION

The halogen-containing unsaturated polyesters to be used in the present invention, substantially differing from general unsaturated polyesters, contain halogen in the molecular structures thereof. The halogen-containing unsaturated polyesters employed include for example unsaturated polyesters prepared by using halogenized carboxylic acids as an acid component or by using halogenized alcohols as an alcohol component.

Such halogen-containing unsaturated polyester to be used in the present invention may be prepared by reacting the following components A and B, or A, B, and C, (A) being an $\alpha, \beta$-unsaturated dibasic acid and/or acid anhydride thereof, (B) being a halogenized carboxylic acid and/or halogenized alcohol, and (C) being a polyhydric alcohol and saturated polybasic acid. Either a halognized alcohol or polyhydric alcohol should be used in any case.

Some illustrative examples of the $\alpha, \beta$-unsaturated dibasic acids and anhydrides thereof which can be used include maleic acid, fumaric acid, itaconic acid, citraconic acid, maleic anhydride, and the like. These may be used in a combination of two or more of them.

Some illustrative examples of the polyhydric alcohols which can be used include dihydric alcohols such as ethylene glycol, diethylene glycol, propylene glycol, dipropylene glycol, 1,3-butanediol, 1,6-hexanediol, and neopentyl glycol, trihydric alcohols such as glycerin and trimethylolpropane, tetrahydric alcohols such as pentaerythritol, and the like. Among the above-described polyhydric alcohols, ether glycols and long chain glycols are particularly effective in softening cured products and thus an excellent low temperature punching quality can be obtained. These polyhydric alcohols may be used in a combination of two or more of them.

Some illustrative examples of the saturated polybasic acids which may be used at need include phthalic acid, phthalic anhydride, isophthalic acid, terephthalic acid, trimellitic acid, trimellitic anhydride, succinic acid, azelaic acid, adipic acid, tetrahydrophthalic acid, tetrahydrophthalic anhydride, hexahydrophthalic acid, hexahydrophthalic anhydride, and rosin-maliec anhydride adduct. These may be used in a combination of two or more of them.

Some illustrative examples of the halogenized carboxylic acids which can be used include chlorinated polybasic acids such as chlorendic acid, chlorendic anhydride, tetrachlorophthalic acid, and tetrachlorophthalic anhydride, brominated polybasic acids such as tetrabromophthalic acid and tetrabromophthalic anhydride, and the like.

The illustrative example of the halogenized polyhydric alcohols which can be used is dibromoneopentyl glycol.

Also, halogen-containing unsaturated polyesters prepared by synthesizing an unsaturated polyester and then incorporating halogens in the molecular structures thereof, for example those disclosed in Japanese Patent Application Publication No. 8,993/1971, may be used in the present invention.

The above-described halogen-containing components may be used in a combination of two or more of them, and the above-described methods of incorporating halogens may be employed in a combination of two or more of them.

Bromine due to its high flame retardant effect is desirably employed as halogen.

The bromine content is preferably 10 to 40% by weight, more preferably 15 to 30% by weight, of the bromine-containing unsaturated polyester.

In order to further increase the flame retardancy of laminates, it is desirable to add flame retardant additives such as antimony compounds and phosphorus compounds.

The above-described method of preparing unsaturated polyesters by reacting an acid component and an alcohol component is mainly carried out by progressing condensation reaction which is progressed by removing water generated during the reaction of the two components.

Typical examples of the reaction apparatus and conditions to be employed for carrying out the reaction will be described below.

The reaction apparatus is to be selected from those made of glass, stainless steel, or the like, and it is preferable to use an reaction apparatus equipped with an fractionation apparatus for preventing distillation of the alcohol component as an azeotropic mixture of water and the alcohol component, a heating means for increasing the temperature of the reaction system, a temperature controlling circuit for the heating device, and a device for blowing nitrogen gas and the like.

With regard to the reaction conditions, it is desirable to carry out the reaction at a sufficiently high temperature, preferably at a temperature of 150° C. or higher. For the purpose of preventing the decomposition of the halogenized carboxylic acids or halogenized alcohols at high temperature, the reaction temperature however is preferably not higher than 170° C.

In order to prevent side reactions which may be caused by oxidation, it is desirable to carry out the reaction while introducing an inert gas such as gaseous nitrogen and carbon dioxide.

The reaction is carried out by heating a mixed system of the acid component and the alcohol component and removing the generated low molecular weight compounds such as condensed water out of the system, and the removal of the low molecular weight compounds is preferably conducted by natural distillation by means of introduction of an inert gas, or by distillation under reduced pressure.

In order to accelerate the distillation of the condensed water, it is also possible to conduct the natural distillation on a reaction system wherein a solvent such as toluene and xylene has been added as an azeotropic component.

The degree of progress of the reaction can be generally determined by measuring the amounts of the distillates generated by the reaction, determinating the terminal functional groups, measuring the viscosity of the reaction system, and the like.

The halogen-containing unsaturated polyester to be used in the present invention has a molecular weight per 1 mole of unsaturated group of 350 to 1,000, preferably 400 to 700.

The molecular weight per 1 mole of unsaturated group larger than 1,000 will cause undesirable occurrence of numerous white fine cracks around punched holes. On the other hand, the molecular weight per 1 mole of unsaturated group less than 350 will cause undesirable occurrence of cracks between holes or delamination of hole edge.

The molecular weight per 1 mole of unsaturated group is calculated by the following formula:

$$\text{Molecular weight per 1 mole of unsaturated group} = \frac{A}{B} \times \frac{\text{Yield (\%)}}{100}$$

A: The total weight of all starting materials used for synthesizing a halogen-containing unsaturated polyester B: The total mole of the α, β-unsaturated dibasic acids and/or anhydrides thereof used for synthesizing a halogen-containing unsaturated polyester Thus obtained halogen-containing unsaturated polyester is dissolved in a polymerizable monomer such as styrene, vinyltoluene, divinylbenzene, methyl methacrylate, and vinyl acetate to prepare a halogen-containing unsaturated polyester resin. At need, various kinds of additives, for example, polymerization inhibitors such as hydroquinone, polymerization accelerators such as cobalt naphthenate, photoactivators such as benzophenone, and peroxides can be added to the resin.

Further, compounds having oxiranic rings such as epichlorohydrin, allyl glycidyl ether, phenyl glycidyl ether, and epoxy resins may be added in order to reduce the color of the product.

Thus prepared and modified halogen-containing unsaturated polyester resin can be cured by adding an peroxide, such as benzoyl peroxide and methyl ethyl ketone peroxide, at room temperature, or by heating the mixture. The curing can also be conducted by irradiating light, electron beam, or the like.

The cured halogen-containing unsaturated polyester resin has a glass transition temperature of 30° to 90° C. In order to make punching possible at low temperatures near the room temperature, the glass transition temperatures of 40° to 65° C. are particularly preferable.

Glass transition temperature varies depending on cross linking density and molecular structure constituting the cross linking, and the control of glass transition temperature may be carried out by varying the kind and amount of the polymerizable monomer, the amounts of α, β-unsaturated dibasic acid and/or anhydride thereof, the kinds and amounts of the acid components and alcohol components, and the like.

Other additives such as flame retardant additives, pigments, and fillers may also be added so long as the glass transition temperature of the cured unsaturated polyester resin is included in the above range.

The glass transition temperature of the cured resin can be determined by measuring thermal expansion coefficient.

The flame retardant unsaturated polyester resin is impregnated into a base material prior to curing. The curing can be conducted on only one base material impregnated with the flame retardant unsaturated polyester resin or on a laminate of two or more impregnated base materials.

Some illustrative examples of the base materials which may be used in the electrical laminates according to the present invention include cellulosic paper base materials such as kraft papers and linter papers; cotton; cellulosic woven or non-woven fabrics such as cotton or rayon; glass fibers; cloth or mats made of glass fibers; and the like. These base materials, as needed, can be used in a combination of two or more of them. Usually, cellulosic paper base materials are mainly used among these base materials, and it is preferable to treat the cellulosic paper base materials previously with a melamine resin such as methylolmelamine to increase the bonding strength between the paper base materials and the flame retardant unsaturated polyester resins.

For example, the pretreatment with a melamine resin can be carried out by impregnating a base material with an aqueous methylolmelamine resin solution by dipping the base material into the resin solution, and then drying the resin solution at 100° to 170° C. It is preferable to adjust the amount of the methylolmelamine resin impregnated (calculated from the difference in weight between the base material before impregnation and the base material after drying) within the range of 5 to 30% by weight.

In the present invention, the method for impregnating the flame retardant unsaturated polyester resin into the base material and the method for curing the same are not particularly limited, and any method common in the art can be employed. For example, the impregnation can be conducted by a flow-coater method, roll-coater method or dipping method. For example, the curing can be conducted by allowing the base materials impregnated with resin under increased pressure or atmospheric pressure, at room temperature or with heating, or by light-irradiating them.

The preferred amount of the flame retardant unsaturated polyester resin to be impregnated in the base material is 35 to 80% by weight of the weight of the total amount of the cured laminate.

The following examples are set forth to more fully and clearly illustrate the present invention and are intended to be, and should be construed as being, exemplary and not limitative of the invention. In the following examples, "part" means part by weight.

EXAMPLES 1 to 6 and COMPARATIVE EXAMPLES 1 to 3

EXAMPLE 1

Into a 4-liter four neck distillation flask equipped with an agitator, condenser, nitrogen gas introducing tube, and thermometer were charged the following materials.

| | |
|---|---|
| maleic anhydride | 314 parts |
| tetrahydrophthalic anhydride | 730 parts |
| ethylene glycol | 248 parts |
| diethylene glycol | 509 parts |
| hydroquinone | 0.2 parts |

Using a mantle heater, the temperature was then elevated to 150° C. over one hour while introducing nitrogen gas slowly, and then further elevated to 200° C. over 5 hours, and the temperature was maintained. As the acid value became 15.7 after about 10 hours, the temperature was decreased to obtain a precursor polyester.

Subsequently, to the same 4-liter four neck distillation flask was added 2,000 parts of methylene chloride to dissolve the above polyester precursor therein. Into the flask was then added dropwise 458 parts of liquid bromine with a dropping funnel having an outlet submerged in the precursor polyester solution. The dropping was completed over 2 hours, while preventing the exothermic due to bromine addition reaction by cooling the 4-liter flask to maintain the temperature of the solution at 25° to 30° C.

Subsequently, the temperature was raised to 150° C., and methylene chloride was removed while introducing nitrogen gas. Finally, the remaining methylene chloride was completely removed out for about 30 minutes under a reduced pressure of 50 mmHg. The yield of the obtained halogen-containing unsaturated polyester was 93.9%, and the molecular weight per 1 mole of unsaturated group was 662.

Subsequently, the halogen-containing unsaturated polyester thus obtained was cooled to 100° C. and a solution prepared by mixing the following compounds was added thereto.

| | |
|---|---|
| styrene | 910 parts |
| epichlorohydrin | 9 parts |
| hydroquinone | 0.3 parts |

The mixture was mixed sufficiently to obtain 3,040 parts of a halogen-containing unsaturated polyester resin (I).

To 100 parts of the obtained resin was then added 2 parts of 50 wt %-benzoylperoxide paste. The mixture was stirred sufficiently, injected between two glass plates which had surfaces covered with polyester film and were spaced each other with spacers of 3 mm in thickness, and the mixture was then cured at 100° C. for 2 hours to obtain a cured product (I) of the halogen-containing unsaturated polyester resin (I).

Measurement of thermal expansion was conducted on the cured product in air at a temperature elevating rate of 5° C./min with a TMA-1 thermomechanical analyzer produced by Perkin Elmer corporation, and the temperature at which the thermal expansion coefficient was largely changed was determined as the glass transition temperature. The glass transition temperature of the cured product (I) was 50.0° C.

Preparation of flame retardant electrical laminate

A kraft paper (kraft paper produced by Sanyo-Kokusaku Pulp Co., Ltd., 140 g/m$^2$) was used as the cellulosic paper base material, and the kraft paper was impregnated with an aqueous solution of 35 g of methylolmelamine (Trade name: MELAN 630 produced by Hitachi Chemical Company, Ltd.) in 100 g of methanol and 100 g of water and then dried at 120° C. for 30 minutes. The weight of the paper was increased by 17.8% by weight.

The treated paper was impregnated with a resin composition prepared by mixing 100 parts of halogen-containing unsaturated polyester resin (I), 2 parts of antimony trioxide, and 2 parts of 50 wt %-benzoylperoxide paste. 6 sheets of thus impregnated and treated paper were laminated. To the outermost surface of the laminate was further laminated one sheet of electrolytic copper foil of 35 μm thick coated with an adhesive (produced by Nippon Denkai Co., Ltd.) on its surface facing to the laminate. Thus obtained laminated was cured at 120° C. for 15 minutes at a pressure of 10 kg/cm² to obtain a copper clad laminate of 1.6 mm in thickness.

The properties of the copper clad laminate thus produced are shown in Table 2.

At the time of measurement of properties, the measurements of water absorption and insulation resistance after boiling were conducted according to JIS C No. 6481, and the measurements of punching quality according to ASTM D-617-44. In the punching quality in Table 2,  means good punched hole, Δ means occurrence of whitening caused by delamination or means occurrence of cracks not so large as to connect holes, x means partial occurrence of severe whitening caused by delamination or means occurrence of cracks connecting holes. So with the following examples.

EXAMPLES 2 to 4

Using the same apparatus as that in Example 1, a polyester was prepared by charging materials shown in Table 1 into a 4-liter flask under conditions similar to those of Example 1. In the same was as Example 1, to the 4-liter flask was added 2,000 parts of methylene chloride, and then the above polyester was dissolved therein, and liquid bromine was added dropwise thereto. Reaction was carried out at a temperature range similar to that of Example 1, i.e., 25° to 30° C. After conclusion of the reaction, methylene chloride was removed in the same way as Example 1 to obtain halogen-containing unsaturated polyesters (II) to (IV). The molecular weights per 1 mole of unsaturated group are shown in Table 1.

The halogen-containing unsaturated polyesters (II) to (IV) were then dissolved in a mixture solution of styrene, epichlorohydrin, and hydroquinone, to prepare halogen-containing unsaturated polyester resins (II) to (IV).

The glass transition temperatures of the cured products (II) to (IV) cured in the same way as Example 1 are shown in Table 1.

Preparation of laminates was also conducted in the same way as Example 1 to obtain copper clad laminates. The properties of the copper clad laminates are shown in Table 2.

COMPARATIVE EXAMPLES 1 and 2

In the same way as Example 1, precursor polyesters were synthesized using the compositions shown in Table 1, and the precursor polyesters were dissolved in methylene chloride and reacted with liquid bromine, and then styrene was added into the flask after removing methylene chloride, to obtain halogen-containing unsaturated polyester resins. Curing and preparation of laminates were carried out in the same way as Example 1.

The glass transition temperatures of the cured products are shown in Table 1, and the properties of the laminates in Table 2.

TABLE 1

Preparation of halogen-containing unsaturated polyester and halogen-containing unsaturated polyester resin and Properties thereof

| | | | Example 1 | Example 2 | Example 3 | Example 4 | Com. Ex. 1 | Com. Ex. 2 |
|---|---|---|---|---|---|---|---|---|
| Material composition for preparing H.U.P.° (wt part) | Material composition for preparing P. P.°° | Maleic anhydride | 314 | 314 | 392 | 392 | 154 | 510 |
| | | Tetrahydrophthalic anhydride | 730 | 730 | 608 | 608 | 973 | 426 |
| | | Ethylene glycol | 248 | 248 | 248 | 99 | — | 546 |
| | | Diethylene glycol | 509 | 509 | 509 | 763 | 928 | — |
| | | Hydroquinone | 0.2 | 0.2 | 0.2 | 0.2 | 0.2 | 0.2 |
| | Dropped liquid bromine | | 458 | 710 | 550 | 575 | 640 | 432 |
| Yield (wt part) | | | 2121 | 2373 | 2170 | 2300 | 2560 | 1776 |
| Yield (wt %) | | | 93.9 | 94.5 | 94.1 | 94.3 | 95.5 | 92.8 |
| Halogen content (wt %) | | | 21.6 | 29.9 | 25.3 | 25.0 | 25.0 | 24.3 |
| Molecular weight per 1 mole of unsaturated group | | | 662 | 741 | 543 | 575 | 1629 | 341 |
| Composition of H.U.P.R.°°° | | Styrene | 910 | 1278 | 930 | 990 | 1100 | 770 |
| | | Epichlorohydrin | 9 | 11 | 9 | 10 | 11 | 8 |
| | | Hydroquinone | 0.3 | 0.4 | 0.3 | 0.3 | 0.4 | 0.3 |
| Yield (wt. part) | | | 3040 | 3662 | 3109 | 3300 | 3671 | 2554 |
| Properties of H.U.P.R.°°° | | Viscosity (poise) | 6.2 | 5.0 | 8.0 | 7.5 | 10.0 | 6.3 |
| | | Heating residue (%) | 69.8 | 64.6 | 69.0 | 69.7 | 69.4 | 69.6 |
| | | Acid value | 10.0 | 9.2 | 8.1 | 7.0 | 11.0 | 13.0 |
| Glass transition temperature of cured product (°C.) | | | 50.0 | 55.0 | 60.5 | 48.0 | 40.0 | 97.0 |

H.U.P.°: Halogen-containing unsaturated polyester
P.P.°°: Precursor polyester
H.U.P.R.°°°: Halogen-containing unsaturated polyester resin

TABLE 2

| | | Properties of laminate | | | | | |
|---|---|---|---|---|---|---|---|
| | Unit | Example 1 | Example 2 | Example 3 | Example 4 | Com. Ex. 1 | Com. Ex. 2 |
| Water absorption | % | 0.54 | 0.51 | 0.60 | 0.42 | 0.75 | 0.40 |
| Insulation resistance | Ω | $5.4 \times 10^8$ | $5.3 \times 10^8$ | $3.0 \times 10^8$ | $5.8 \times 10^8$ | $1.0 \times 10^8$ | $8.5 \times 10^8$ |

TABLE 2-continued

| | | Properties of laminate | | | | | |
|---|---|---|---|---|---|---|---|
| | Unit | Example 1 | Example 2 | Example 3 | Example 4 | Com. Ex. 1 | Com. Ex. 2 |
| after boiling | | | | | | | |
| UL-STD flame retardancy | — | 94 V-O Passing | 94 V-O Passing | 94 V-O Passing | 94 V-O Passing | 94 V-O Passing | 94 V-O Passing |
| Punching quality | 21° C. | — | O~Δ | O~Δ | O~Δ | O~Δ | O~Δ | X |
| (Surface | 40° C. | — | O | O | O | O | Δ | Δ |
| temperature | 62° C. | — | O | O | O | O | Δ | O~Δ |
| of laminate) | 85° C. | — | O~Δ | O~Δ | O | O | X | O |

EXAMPLE 5

Into a 3-liter four neck distillation flask equipped with an agitator, condenser, nitrogen gas introducing tube, and thermometer were charged the following materials.

| | |
|---|---|
| isophthalic acid | 406 parts |
| diethylene glycol | 433 parts |

The temperature was then elevated to 150° C. over one hour with a mantle heater while introducing nitrogen gas slowly, and then further elevated to 220° C. over 5 hours, and the temperature was maintained at 220° C. As the acid value became 6 after about 5 hours, the temperature was decreased, and the following materials were further charged.

| | |
|---|---|
| maleic anhydride | 320 parts |
| adipic acid | 357 parts |
| dibromoneopentyl glycol | 984 parts |

The temperature was then elevated to 165° C. over 1.5 hours while introducing nitrogen gas slowly. The temperature was maintained at 165° C. After about 10 hours, the acid value became 20 and then the temperature was decreased to stop the reaction. The yield of the obtained halogen-containing unsaturated polyester was 91%, and the molecular weight per 1 mole of unsaturated group was 696.

Subsequently, to the halogen-containing unsaturated polyester thus obtained were added the following materials.

| | |
|---|---|
| styrene | 1,220 parts |
| epichlorohydrin | 17 parts |
| hydroquinone | 0.35 parts |

The mixture was mixed sufficiently to obtain 3,507 parts of a halogen-containing unsaturated polyester resin (V).

To 100 parts of the obtained resin was then added 2 parts of 50 wt %-benzoylperoxide paste. The mixture was stirred sufficiently, injected between two glass plates which had surfaces covered with polyester film and were spaced each other with spacers of 3 mm in thickness, and then cured at 100° C. for 2 hours to obtain a cured product (V) of the halogen-containing unsaturated polyester resin (V).

The glass transition temperature of the cured product was determined in the same way as Example 1 using a TMA-1 thermomechanical analyzer produced by Perkin Elmer Corporation to be 63.0° C.

In the same way as Example 1, a kraft paper treated with methylolmelamine was impregnated with a resin composition prepared by mixing 100 parts of halogen-containing unsaturated polyester resin (V), 2 parts of antimony trioxide, and 2 parts of 50 wt %-benzoylperoxide paste. The papers thus treated and impregnated and electrolytic copper foil were laminated and cured, to obtain a copper clad laminate of 1.6 mm in thickness.

The properties of thus produced copper clad laminate are shown in Table 3.

EXAMPLE 6

Using the same apparatus as those of Example 5, the following materials were charged, and the temperature was elevated to 165° C. over one hour while introducing nitrogen gas.

| | |
|---|---|
| maleic anhydride | 320 parts |
| adipic acid | 286 parts |
| isophthalic acid | 217 parts |
| dibromoneopentyl glycol | 1,539 parts |
| diethylene glycol | 138 parts |

Reaction was continued with maintaining the temperature until the acid value became 25 after about 16 hours, and then the temperature was decreased to stop the reaction. The yield of the obtained halogen-containing unsaturated polyester was 93% and the molecular weight per 1 mole of unsaturated group was 714.

Subsequently, to the halogen-containing unsaturated polyester were added the following materials.

| | |
|---|---|
| styrene | 1,250 parts |
| epichlorohydrin | 18 parts |
| hydroquinone | 0.36 parts |

The mixture was then mixed sufficiently to obtain 3,598 parts of a halogen-containing unsaturated polyester resin (VI).

To 100 parts of the resin was added 2 parts of 50 wt %-benzoylperoxide paste, and curing was carried out in the same way as Example 5. The glass transition temperature of the cured product was measured to be 70° C.

In the same way as Example 5, a copper clad laminate was produced. The properties thereof are shown in Table 3.

COMPARATIVE EXAMPLE 3

Using the same apparatus as those of Example 5, the following materials were charged, and the temperature was elevated to 165° C. over one hour while introducing nitrogen gas.

| | |
|---|---|
| maleic anhydride | 175 parts |
| adipic acid | 260 parts |
| phthalic anhydride | 352 parts |

-continued

| | |
|---|---|
| dibromoneopentyl glycol | 1,713 parts |

Reaction was carried out with maintaining the temperature until the acid value became 18 after about 13 hours, and the temperature was decreased to stop the reaction. The yield of the obtained halogen-containing unsaturated polyester was 94% and the molecular weight per 1 mole of unsaturated group was 1,327.

Subsequently, to the halogen-containing unsaturated polyester were added the following materials.

| | |
|---|---|
| styrene | 1,270 parts |
| epichlorohydrin | 18 parts |
| hydroquinone | 0.36 parts |

The mixture was mixed sufficiently to obtain 3,648 parts of a halogen-containing unsaturated polyester (VII).

The glass transition temperature of the cured product cured in the same way as Example 5 was 25° C.

The properties of the copper clad laminate produced in the same way as Example 5 are shown in Table 3.

TABLE 3

| | | Properties of laminate | | |
|---|---|---|---|---|
| | Unit | Example 5 | Example 6 | Com. Ex. 3 |
| Water absorption | % | 0.54 | 0.35 | 0.90 |
| Insulation resistance after boiling | Ω | $4.0 \times 10^8$ | $6.5 \times 10^8$ | $9.0 \times 10^7$ |
| UL-STD flame retardancy | — | 94 V-O Passing | 94 V-O Passing | 94 V-O Passing |
| Punching quality (Surface temperature of laminate) | 20° C. | — | O~Δ | Δ | O |
| | 40° C. | — | O | O | Δ |
| | 60° C. | — | O | O | Δ~X |
| | 80° C. | — | O | O | X |

What is claimed is:

1. A flame retardant electrical laminate prepared by impregnating a base material with a halogen-containing unsaturated polyester resin which is prepared by dissolving a halogen-containing unsaturated polyester into a polymerizable monomer: and then curing the halogen-containing unsaturated polyester resin; wherein the halogen-containing unsaturated polyester has a molecular weight per 1 mole of unsaturated group of 350 to 1,000, and the cured halogen-containing unsaturated polyester resin has a glass transition temperature of 30° to 90° C.

2. The flame retardant electrical laminate according to claim 1 wherein the base material is a cellulosic paper base material treated with a melamine resin.

3. The flame retardant electrical laminate according to claim 1 wherein the halogen contained in the halogen-containing unsaturated polyester is bromine.

4. The flame retardant electrical laminate according to claim 3 wherein the bromine content of the halogen-containing unsaturated polyester is 10 to 40% by weight.

5. A flame retardant electrical laminate prepared by impregnating a base material with a halogen-containing unsaturated polyester resin which is prepared by dissolving a halogen-containing unsaturated polyester into a polymerizable monomer; laminating a predetermined number of so impregnated base materials; and then curing the halogen-containing unsaturated polyester resin; wherein the halogen-containing unsaturated polyester has a molecular weight per 1 mole of unsaturated group of 350 to 1,000, and the cured halogen-containing unsaturated polyester resin has a glass transition temperature of 30° to 90° C.

6. The flame retardant electrical laminate according to claim 5 wherein the base material is a cellulosic paper base material treated with a melamine resin.

7. The flame retardant electrical laminate according to claim 5 wherein the halogen contained in the halogen-containing unsaturated polyester is bromine.

8. The flame retardant electrical laminate according to claim 7 wherein the bromine content of the halogen-containing unsaturated polyester is 10 to 40% by weight.

9. The flame retardant electrical laminate according to claim 4, wherein the base material is a cellullosic paper base material treated with a melamine resin.

10. The flame retardant electrical laminate according to claim 9, wherein the amount of melamine resin is in a range of 5 to 30% by weight.

11. The flame retardant electrical laminate according to claim 10, wherein the polymerizable monomer is selected from the group consisting of styrene, vinyl toluene, divinyl benzene, methylmethacrylate and vinyl acetate.

12. The flame retardant electrical laminate according to claim 8, wherein the base material is a cellullosic paper base material treated with a melamine resin.

13. The flame retardant electrical laminate according to claim 12, wherein the amount of melamine resin is in a range of 5 to 30% by weight.

14. The flame retardant electrical laminate according to claim 13, wherein the polymerizable monomer is selected from the group consisting of styrene, vinyl toluene, divinyl benzene, methylmethacrylate and vinyl acetate.

15. The flame retardant electrical laminate according to claim 1, wherein said laminate exhibits excellent punching quality over a wide temperature range including temperatures near room temperature.

* * * * *